United States Patent [19]
Fontana
[11] 3,843,256
[45] Oct. 22, 1974

[54] PRESS FOR EXPOSURE AND PHOTOENGRAVING

[75] Inventor: Anna Fontana, Trezzo D'Adda, Italy
[73] Assignee: Michele Catellono, Milan, Italy

[22] Filed: Feb. 26, 1973
[21] Appl. No.: 336,098

[30] Foreign Application Priority Data
Mar. 3, 1972 Italy ................................ 21403/72

[52] U.S. Cl. .................. 355/89, 29/203 P, 20/625, 96/36.2
[51] Int. Cl. ...................... G03b 27/04, G03b 27/20
[58] Field of Search ........... 29/200 J, 200 P, 203 B, 29/203 J, 203 P, 625, 628; 33/184.5; 269/21; 355/72–75, 89–94; 96/36.2

[56] References Cited
UNITED STATES PATENTS
1,745,900 2/1930 Lowen ................................ 355/74
2,720,146 10/1955 Mears ................................ 355/89
3,531,198 9/1970 Delp ................................ 355/89 X
3,625,611 12/1971 Orr ................................ 355/91 X FOREIGN PATENTS OR APPLICATIONS
884,766 12/1961 Great Britain ....................... 355/89

*Primary Examiner*—Roy Lake
*Assistant Examiner*—Neil Abrams
*Attorney, Agent, or Firm*—Dr. Guido Modiano; Dr. Albert Josif

[57] ABSTRACT

A press for exposure and photoengraving, in particular for the plates of circuits printed on a single or double face, comprising two polygonal frames each bearing a working panel of transparent material. The two polygonal frames are hinged along one side and one of them supports guide members to which are connected centering devices of mechanical type. Vacuum is formed between the panels when they are brought together. The position of the panels can be varied with respect to the polygonal frames.

3 Claims, 3 Drawing Figures

PATENTED OCT 22 1974 3,843,256

SHEET 2 OF 2

PRESS FOR EXPOSURE AND PHOTOENGRAVING

BACKGROUND OF THE INVENTION

This invention relates to a press for exposure and photoengraving, in particular for printed circuits on a single or double face, particularly suitable for placing three panels in register with respect to each other.

In the stated field of application, the problems and disadvantages which arise when it is necessary to centre place three different panels, or rather reference points on three different panels in register with respect to each other, are well known.

Photoengraved printed circuits are obtained according to one known process by projecting actinic light on to a multi-layer lamination of copper and insulating substances, covered with photosensitive emulsions. Suitable master negatives, here-inafter called matrices, consisting of sheets of transparent material on to which shapes which reproduce the paths of the circuit are transferred, separate those zones to be exposed to the light from the others.

After exposure to light, according to one known process, the photoengravure obtained is developed in appropriate chemical baths.

It is at the stage immediately preceding exposure to light where various disadvantages arise in the present method used for registration. The plates to be engraved comprise holes into which the electronic components of the circuit will be connected, and in which the various branches of the circuit must terminate. It is thus very important that the shapes present on the matrix, and which will define the disposition of the various branches, become perfectly connected with the holes present on the plate to be engraved, so that in the finished circuit the connection of the components to the various branches is perfect.

On the matrix, at points corresponding to the holes on the plate, small black circles are printed having a certain diameter. During registration of the matrix on the plate, it is very difficult for the worker carrying out the operation to make the centre of each hole to perfectly coincide with the centre of the relative small circle, due to the fact that the circle covers the hole and hides it from view.

This problem is evidently aggravated when the plate has to be engraved on both faces. When it is considered that the registration operation has to be repeated, at the present state of the art, for each plate, then it is evident that the disadvantages due to the absence of effective registration devices are considerable.

SUMMARY OF THE INVENTION

The main object of this invention is to eliminate the stated disadvantages, by providing a type of press for exposure and photoengraving, capable of enabling perfect mutual registration between elements on three different panels to be obtained. This and further objects which will be more evident hereinafter are attained by a press for exposure and photoengraving, in particular for the plates of circuits printed on a single or double face, comprising a first working panel of transparent material stretched on a first polygonal frame, and a second working panel also of transparent material stretched on a second polygonal frame, hinged along one side to said first frame, means being provided for forming a vacuum between said first and second panel when they are brought together, characterised in that said second frame supports guide members to which are connected centering devices of mechanical type, said guide members being arranged to make said centering devices traverse, between said working panels and frames there being also interposed registration members for varying the position of said panels with respect to said frames.

BRIEF DESCRIPTION OF THE DRAWINGS

Further characteristics and advantages of the invention will be more evident from the detailed description of a preferred but not exclusive embodiment of a press according to the invention, illustrated by way of non-limiting example in the accompanying drawings in which.

DESCRIPTION OF THE PREFERRED EMBODIMENT

Figure 1:
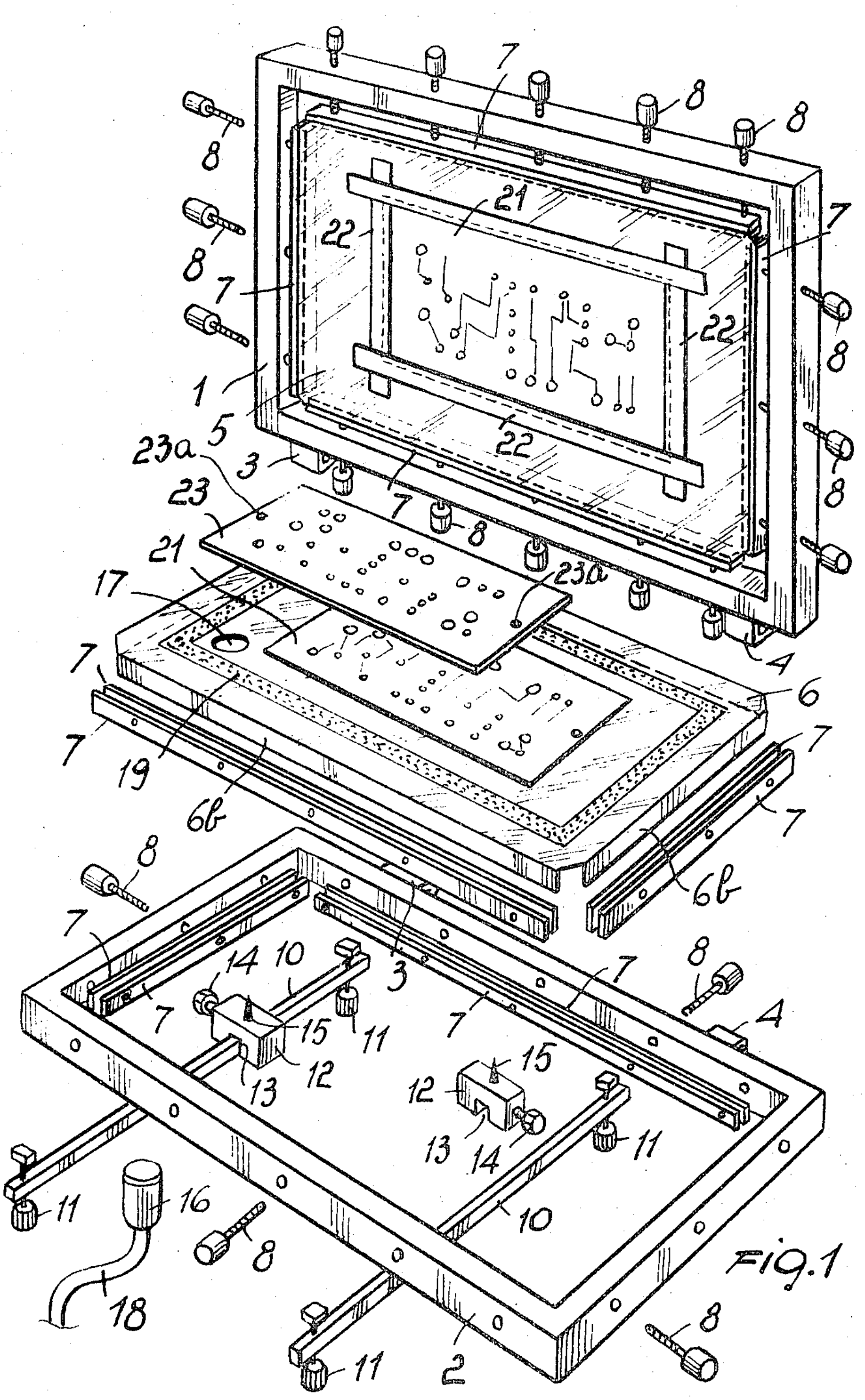
FIG. 1 is an exploded view of the press according to the invention.
Figure 2:
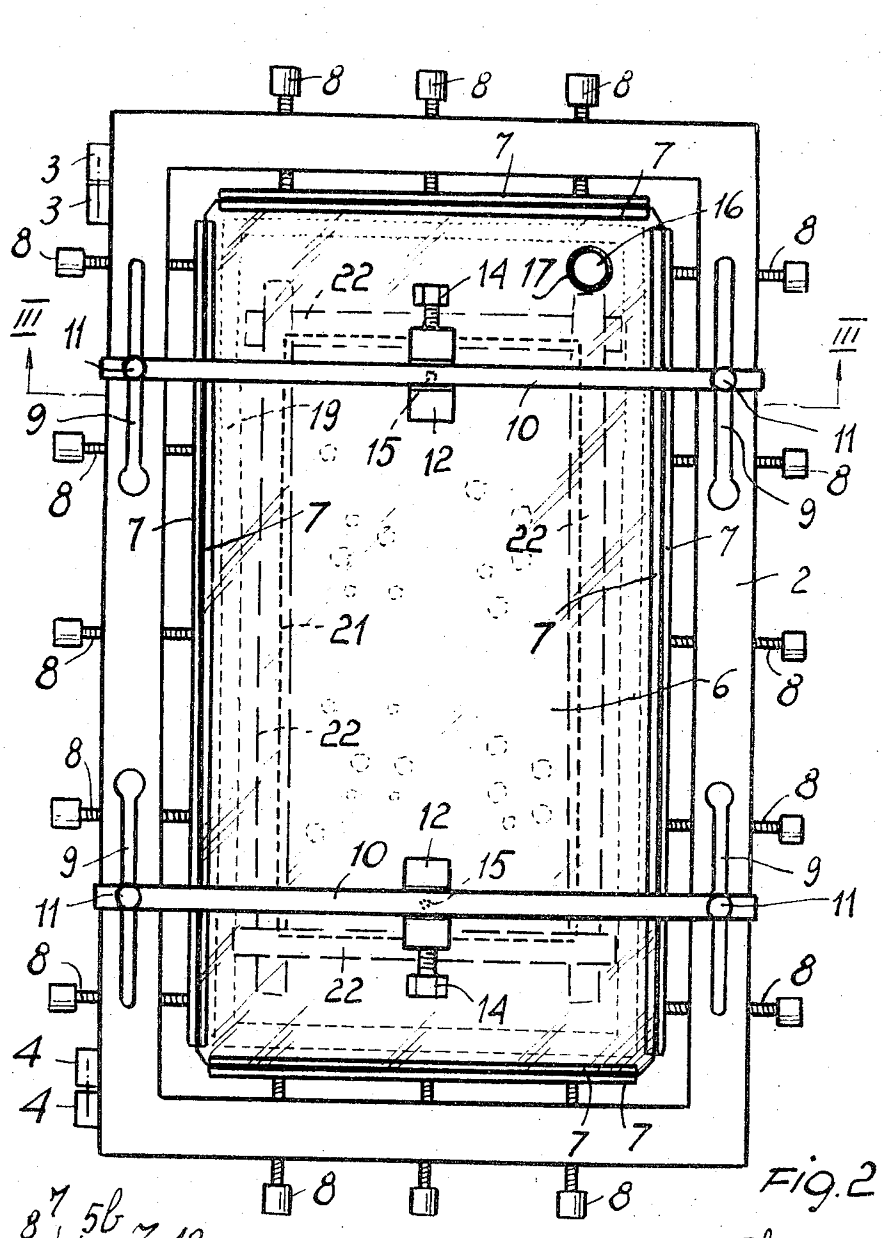
FIG. 2 is a view of the external lower end of the press according to the invention.
Figure 3:
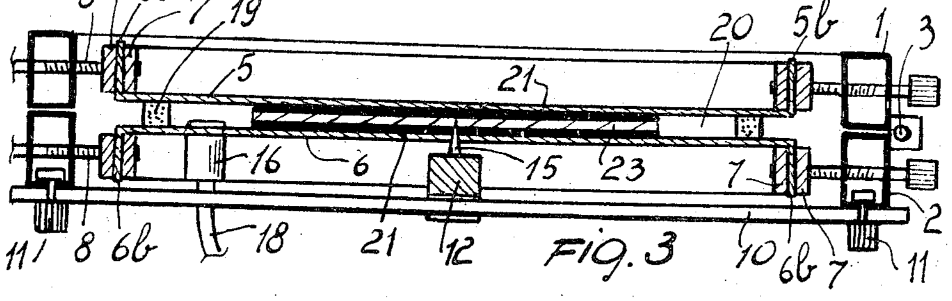
FIG. 3 is a section on the line III—III of FIG. 2.

With reference to the stated figures, the press according to the invention comprises a first and a second frame 1 and 2 respectively, of rectangular shape, hinged together at 3 and 4. To the frames 1 and 2 are fixed a first and a second working panel, 5 and 6 respectively, consisting of transparent sheet material. More precisely, the panels 5 and 6 are fixed to the respective frames 1 and 2 by sticks 7 of rectangular cross-section, which clamp the perimetral edges **5*b* and 6*b* of the panels 5 and 6 in pairs. The sticks 7 are present on each of the perimetral edges of the panels 5 and 6, which are bent over as shown in FIG. 1 and are screwed one against the other by screws 8, which suspend the panels 5 and 6 on the frames 1 and 2, keeping the sheet material of which said panels are formed fixed. The centering devices are hereinafter described. In the lower part of the two long sides of the frame 2 there are four guide slots 9 which extend parallel to the two sides in which they are formed. Bridges 10 are slidingly engaged in the guides 9 by means of pairs of nuts and bolts 11, and are disposed perpendicular to these guides. Each bridge 10 is engaged, as shown in FIG. 2, in two parallel guides 9 on opposing sides of the frames 1 or 2. The bridges 10 consist of prismatic structures which act as guides for blocks 12, which can slide on said bridges and are engaged therewith by way of slots 13. Suitable screws 14 act as stop and locking members for the blocks 12 on the bridges 10**.

The blocks 12 comprise points 15 facing upwards, arranged to perforate the material of which the panel 6 is formed.

The press according to the invention also comprises means for creating a vacuum between the panels 5 and 6, for favouring perfect adherence between the panels which support the matrices and the plate to be photoengraved contained between the panels. These means comprise a suction nozzle 16 opening into a hole 17 provided in the panel 6. A pipe 18 is connected to the nozzle 16 and to a vacuum pump, not shown. On the panel 6 is fixed a perimetral gasket 19, of yieldable material, to seal the interspace 20 between the panels 5 and 6 against the atmosphere when they are brought together.

The figures of the accompanying drawings also show two matrices 21 for photoengravure, consisting of printed sheets of transparent material of the same nature as that used for the panels 5 and 6, so as to give equal optical properties. The matrices 21 are fixed, one to a panel, by pieces of adhesive tape 22. Between the matrices 21 is placed a plate 23 to be photoengraved, which is able to engage in the points 15 by means of suitable holes 23*a*.

The operation of the device according to the invention is as follows.

The worker responsible for the press first centers a plate to be photoengraved on the points 15 of the blocks 12 by means of the appropriate holes provided on the plate. It should be stated at this point that as evidently the usefulness of the invention is emphasized especially when producing large quantities of circuits, the press is adjusted in relation to one plate which constitutes the sample for a batch of plates to be photoengraved; once it has been adjusted on the sample, the press according to the invention may be used for photoengraving the entire batch of plates, without further centering or adjusting operations.

By sliding the bridges 10 in the guides 9 and the blocks 12 on the bridges 10, the points 15 may be positioned in such a manner that they retain a plate 23 to be photoengraved in a position suitable for receiving the beam of actinic light to be projected, owing to the fact that the points 15 are engaged in the appropriate holes 23*a* arranged on the plate 23. Obviously to do this it is necessary to perforate and slightly tear the panel 6 with the points 15 as the plate 23 has to be inserted between the two panels 5 and 6. However the two holes thus produced are always outside the field of projection of the light and hence in no way damage the photoengraving operation.

A first approximate registration operation is then made by positioning two matrices 21 roughly, one on each face of the plate 23 which has been used for positioning the points 15 and which has been removed from the press. The plate 23, with the two matrices attached one on each side, is again placed on the points 15, then closed between the panels 5 and 6 so that the matrices 21 become attached one to each panel by means of suitably disposed double adhesive tape 22. As clearly visible from FIG. 2 of the drawing the double adhesive tape 22 covers only a thin margin of the matrices or master negatives 21, while the remaining part of the double adhesive tape adheres to the surface of the panels 5 and 6. At this point the final accurate registration of the matrices 21 with respect to the plate 23 can be carried out. For this the screws 8 which suspend the panels 5 and 6 on the frames 1 and 2 by means of the sticks 7 are rotated. By suitably rotating the screws 8, the panels 5 and 6 and hence the matrices 21 adhering to them can be made to carry out micrometric movements, which enable the perfect registration of the shapes traced on the matrices 21 to be obtained with respect to the holes present on the plate 23. It will be thus understood that the screws 8 besides holding in place the panels 5 and 6 act also as independent micrometric registration devices. Successively one or more test exposures can be made, and once the result of these has been seen and if necessary any corrections made, any number of plates 23 can be photoengraved without having to repeat the registration operation each time. The use of the press according to the invention is particularly advantageous when each plate to be photoengraved is to comprise a number of equal circuits; in this case, after photoengraving, the plate is cut by a suitable machine so as to separate the various circuits. In this case it is particularly important that the registration has been perfectly carried out or, at least, if there has been an error it is always in the same position so that once the machine for cutting the plate has been adjusted there is no risk of ruining those parts of the circuits which have not been perfectly printed in axis with the rest of the production.

The invention so conceived is susceptible to numerous modifications all of which fall within the scope of the inventive idea, and all details may be replaced by others technically equivalent.

The materials used and dimensions may be chosen according to requirements.

I claim:

1. A press for exposure and photoengraving, in particular for the plates of circuits printed on a single or double face, comprising a first polygonal frame, a first working panel of transparent material placed over said first frame and removably fixed thereon, a second polygonal frame hinged along one side to said first frame, a second working panel of transparent material placed over said second frame and removably fixed thereon, means for forming a vacuum between said first and second panels when they are brought together, said first and second working panels having respective master negatives removably fixed thereon, wherein according to the improvement, said second frame has adjustable centering devices supported thereon for centering said plate to be exposed and photoengraved in a selected fixed position, and wherein the press further comprises independent registration devices for each of said first and second working panels to provide independent registration movements of said first and second polygonal frames with said first and second working panels fixed thereon and with said respective master negatives, following the registration movements of said first and second frames while said plate to be exposed and photoengraved is maintained fixed on said adjustable centering devices.

2. A press according to claim 1, wherein said adjustable centering devices comprise each at least one slidable bridge member extending across said second frame, guide means on said second frame for slidably supporting said bridge member thereon, and locking members for removably locking said bridge member on said guide means, at least one block member slidable along said bridge member and having locking means for removably locking said block member in a selected position on said bridge member, each of said block members having a point means rigid therewith and extending perpendicular to said second frame member and adapted to perforate said working panel when locked in its selected position, and fixedly engage said plate to be exposed and photoengraved.

3. A press according to claim 1, wherein said independent registration devices are of micrometric type and comprise each a plurality of adjustable screw means each independently engaging each of the sides of said first and second frames.

* * * * *